United States Patent
Frank

(10) Patent No.: US 10,523,196 B2
(45) Date of Patent: Dec. 31, 2019

(54) ELECTRONIC CIRCUIT WITH UNDERVOLTAGE LOCKOUT FUNCTION

(71) Applicant: Infineon Technologies Austria AG, Villach (AT)

(72) Inventor: Wolfgang Frank, Augsburg (DE)

(73) Assignee: Infineon Technologies Austria AG (AT)

( * ) Notice: Subject to any disclaimer, the term of this patent is extended or adjusted under 35 U.S.C. 154(b) by 0 days.

(21) Appl. No.: 16/177,826

(22) Filed: Nov. 1, 2018

(65) Prior Publication Data
US 2019/0140633 A1 May 9, 2019

(30) Foreign Application Priority Data
Nov. 3, 2017 (DE) .......................... 10 2017 125 726

(51) Int. Cl.
| | | |
|---|---|---|
| H03K 17/284 | (2006.01) | |
| H03K 17/22 | (2006.01) | |
| G01R 19/165 | (2006.01) | |
| H03K 17/06 | (2006.01) | |

(52) U.S. Cl.
CPC ..... *H03K 17/223* (2013.01); *G01R 19/16538* (2013.01); *H03K 17/06* (2013.01); *H03K 17/22* (2013.01); *H03K 2217/0081* (2013.01)

(58) Field of Classification Search
USPC ................................................ 327/108–112
See application file for complete search history.

(56) References Cited

U.S. PATENT DOCUMENTS

| | | | | |
|---|---|---|---|---|
| 4,661,910 A | * | 4/1987 | Reinecke ............... | B60T 8/885 |
| | | | | 303/122.04 |
| 5,805,401 A | * | 9/1998 | Schuellein ............ | H03K 17/30 |
| | | | | 361/115 |
| 5,841,313 A | * | 11/1998 | Levin ............... | H02M 3/33561 |
| | | | | 327/393 |
| 10,013,032 B1 | * | 7/2018 | Ferris .................... | G11B 5/5526 |
| 10,381,918 B1 | * | 8/2019 | Stoichita ................. | H02M 1/15 |
| 2004/0108875 A1 | * | 6/2004 | Kaushik ............... | H03K 17/166 |
| | | | | 327/112 |
| 2005/0134345 A1 | * | 6/2005 | McClure ................... | G06F 1/24 |
| | | | | 327/198 |

(Continued)

FOREIGN PATENT DOCUMENTS

DE    102005015990 A1    3/2006

*Primary Examiner* — Adam D Houston
(74) *Attorney, Agent, or Firm* — Design IP

(57) ABSTRACT

An electronic circuit and a method are disclosed. The electronic circuit includes a first supply node and a second supply node configured to receive a supply voltage, an input configured to receive an input signal, and an output configured to be coupled to a control node of a transistor device. The electronic circuit further includes an undervoltage lockout (UVLO) circuit configured to perform a comparison of the supply voltage and a UVLO threshold. The electronic circuit is configured to operate in one of a first operating mode or a second operating mode based on the comparison. The UVLO circuit is configured to generate the UVLO threshold based on the supply voltage, and the electronic circuit is configured to generate the output signal, in the first mode, dependent on the input signal and to generate the output signal, in the second mode, in a predefined fashion independent of the input signal.

19 Claims, 8 Drawing Sheets

(56) References Cited

U.S. PATENT DOCUMENTS

| | | | |
|---|---|---|---|
| 2005/0184714 A1* | 8/2005 | Rusu | H02M 1/38 323/282 |
| 2006/0186955 A1* | 8/2006 | Quilter | H03F 1/32 330/10 |
| 2009/0206788 A1* | 8/2009 | Ando | H02P 8/22 318/696 |
| 2011/0050308 A1 | 3/2011 | Huang et al. | |
| 2012/0303189 A1* | 11/2012 | Namuduri | B60W 20/00 701/22 |
| 2014/0078629 A1* | 3/2014 | Cortigiani | H03K 17/0822 361/79 |
| 2016/0111061 A1* | 4/2016 | Thenus | H02M 3/1584 345/173 |
| 2017/0141545 A1* | 5/2017 | Yamamoto | H03K 17/0828 |
| 2019/0028095 A1* | 1/2019 | Sanchez | H03K 17/063 |
| 2019/0123737 A1* | 4/2019 | Fort | H03K 17/223 |
| 2019/0140633 A1* | 5/2019 | Frank | G01R 19/16538 |

\* cited by examiner

ELECTRONIC CIRCUIT WITH UNDERVOLTAGE LOCKOUT FUNCTION

FIELD

This disclosure in general relates to an electronic circuit and, in particular, to an electronic circuit for driving a transistor device.

BACKGROUND

An electronic circuit for driving a transistor device, which may also be referred to as drive circuit, usually includes a first supply node for receiving a first supply potential, a second supply node for receiving a second supply potential, an input for receiving an input signal, and an output for providing an output signal to the transistor device. The drive circuit is configured to generate a drive signal based on a supply voltage, which is a voltage between the first supply potential and the second supply potential, and in accordance with the input signal. Generating the drive signal may include coupling the output to the first supply node or the second supply node dependent on the input signal. The drive circuit may further include an undervoltage lockout (UVLO) circuit that monitors the supply voltage and deactivates (disables) the drive circuit if the supply voltage falls below a predefined UVLO threshold.

Different types of transistor devices may require different first and second supply potentials and different UVLO thresholds. There is a need for a drive circuit that is configured to drive various types of transistor devices.

SUMMARY

One example relates to an electronic circuit. The electronic circuit includes a first supply node and a second supply node configured to receive a supply voltage, an input configured to receive an input signal, an output configured to be coupled to a control node of a transistor device, and an undervoltage lockout (UVLO) circuit configured to compare the supply voltage with a UVLO threshold. The electronic circuit is configured to operate in one of a first operating mode or a second operating mode based on the comparing. The UVLO circuit is configured to generate the UVLO threshold based on the supply voltage in a calibration routine, and the electronic circuit is configured to generate the output signal, in the first mode, dependent on the input signal and, in the second mode, in a predefined fashion independent of the input signal.

Another example relates to a method. The method includes adjusting a UVLO threshold of an electronic circuit having a first supply node and a second supply node configured to receive a supply voltage, an input configured to receive an input signal, and an output configured to be coupled to a control node of a transistor device. Adjusting the UVLO threshold includes adjusting the UVLO threshold based on the supply voltage in a calibration routine.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
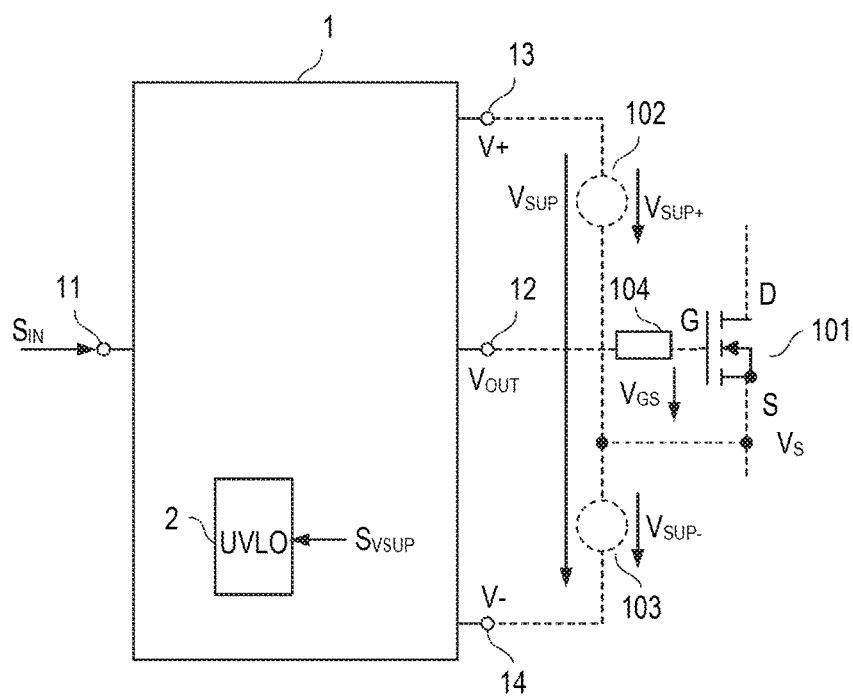
FIG. 1 schematically illustrates one example of an electronic drive circuit configured to drive a transistor device and having an input, an output, a first supply node and a second supply node.

FIG. 1 schematically illustrates one example of an electronic drive circuit 1 that is configured to drive a transistor device 101. For illustration purposes, a transistor device 101 is also illustrated in FIG. 1. Just for the purpose of illustration, the transistor device 101 is drawn as a Metal Oxide Semiconductor Field-Effect Transistor (MOSFET), in particular, an n-type enhancement MOSFET. This, however, is only an example. Any other type of transistor device such as any other type of MOSFET or an Insulated Gate Bipolar Transistor (IGBT) may be driven by the drive circuit 1 as well.

Referring to FIG. 1, the drive circuit 1 includes an input 11 configured to receive an input signal $S_{IN}$, an output 12 configured to be coupled to a control node of the transistor device 101, a first supply node 13, and a second supply node 14. In the MOSFET 101 shown in FIG. 1, the control node is a gate node G. Optionally, a resistor 104, which is referred to as gate resistor in the following, may be connected between the output 12 of the drive circuit 1 and the control node (gate node). The first supply node 13 and the second supply node 14 are configured to receive a supply voltage $V_{SUP}$. This supply voltage $V_{SUP}$ is generated by a voltage source arrangement that is connected to the first supply node 13 and the second supply node 14 when the drive circuit 1 is in operation. According to one example, the supply voltage $V_{SUP}$ includes at least one voltage component $V_{SUP+}$, $V_{SUP-}$ and the voltage source arrangement generates the supply voltage $V_{SUP}$ such that the at least one voltage component $V_{SUP+}$, $V_{SUP-}$ is referenced to a first load node S of the transistor device 101. This first load node S is also referred to as source node in the following, an electrical potential at this source node is referred to as source potential $V_S$ in the following.

In the example shown in FIG. 1, the voltage source arrangement includes a first voltage source 102 coupled between the first load node S and the first supply node 13 and configured to generate a first voltage $V_{SUP+}$, which forms a first voltage component of the supply voltage $V_{SUP}$. The first voltage source 102 is coupled between the first supply node 13 and the first load node S such that the electrical potential V+ at the first supply node 13, which is referred to as first supply potential V+ in the following, is higher than the electrical potential $V_S$ at the first load node S. The second supply node 14, in operation of the drive circuit 1, is either connected to the second load node S or, as illustrated in FIG. 1, a second voltage source 103 is connected between the second load node S and the second supply node 14. This optional second voltage source 103 is connected between the second load node S and the second supply node 14 such that the electrical potential V− at the second supply node 14, which is referred to as second supply potential V− in the following, is below the electrical potential $V_S$ at the second load node S. This second voltage source provides a second voltage $V_{SUP-}$, which forms a second voltage component of the supply voltage $V_{SUP}$.

The transistor device 101 is a voltage controlled transistor device and switches on or off dependent on a voltage $V_{GS}$ between the control node (gate node) and the first load node (source node). This voltage is also referred to as gate-source voltage $V_{GS}$ in the following. The transistor device 101 may be used as an electronic switch for switching an electrical load connected in series with a load path of the transistor device 101. The load path is an internal path of the transistor device 101 between the first load node S and a second load node D, which is a drain node in the example shown in FIG. 1.

Figure 2A:
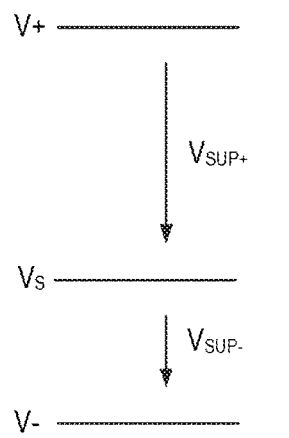
FIGS. 2A and 2B illustrates examples of relationships between a first supply potential that may be received by the first supply node, a second supply potential that may be received by the second supply node, and an electrical potential at a load node (source node) of a transistor device.
Figure 2B:
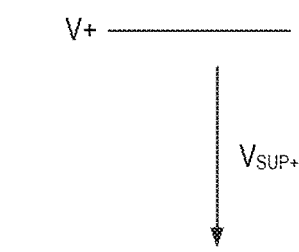

FIGS. 2A and 2B schematically illustrate relationships between the first and second supply potentials V+, V− and the source potential $V_S$. FIG. 2A illustrates the relationship between these potentials if there is a second voltage source 103. In this case, the source potential $V_S$ is between the first supply potential V+ and the second supply potential V−. A difference between the first supply potential V+ and the source potential V− is given by the first voltage $V_{SUP+}$ provided by Equation (1a):

$$(V+) - V_S = V_{SUP+} \quad (1a)$$

Furthermore, a difference between the source potential VS and the second supply potential V− is given by the second voltage $V_{SUP-}$ provided by Equation (1b):

$$(V_S) - (V-) = V_{SUP-} \quad (1b)$$

FIG. 2B illustrates the relationship between the first and second supply potential V+, V− and the source potential $V_S$ if the second voltage source 103 is omitted and the second supply node 14 is connected to the second load node S. In this example, the second supply potential V− equals the source potential $V_S$.

Referring to FIG. 1, the drive circuit 1 includes an undervoltage lockout (UVLO) circuit 2. The UVLO circuit 2 is configured to compare the supply voltage $V_{SUP}$ with a UVLO threshold. The drive circuit 1 operates in one of a first operating mode or a second operating mode based on this comparing. According to one example, the electronic circuit operates in the first operating mode if the supply voltage $V_{SUP}$ is higher than the UVLO threshold and in the second operating mode if the supply voltage $V_{SUP}$ is lower than UVLO threshold. The first operating mode is also referred to as normal mode and the second operating mode is also referred to as UVLO mode in the following.

According to one example, monitoring the supply voltage $V_{SUP}$ by the UVLO circuit 2 includes monitoring a supply voltage signal $S_{VSUP}$ which represents the supply voltage $V_{SUP}$. According to one example, the supply voltage signal $S_{VSUP}$ is proportional to the supply voltage $V_{SUP}$. This supply voltage signal $S_{VSUP}$ may be generated by any type of voltage measurement circuit that is suitable to measure the supply voltage $V_{SUP}$ and generate the supply voltage signal $S_{VSUP}$ representing the supply voltage $V_{SUP}$. Examples of how the supply voltage signal $V_{SUP}$ may be generated based on the supply voltage $V_{SUP}$ are explained herein further below.

Figure 3:
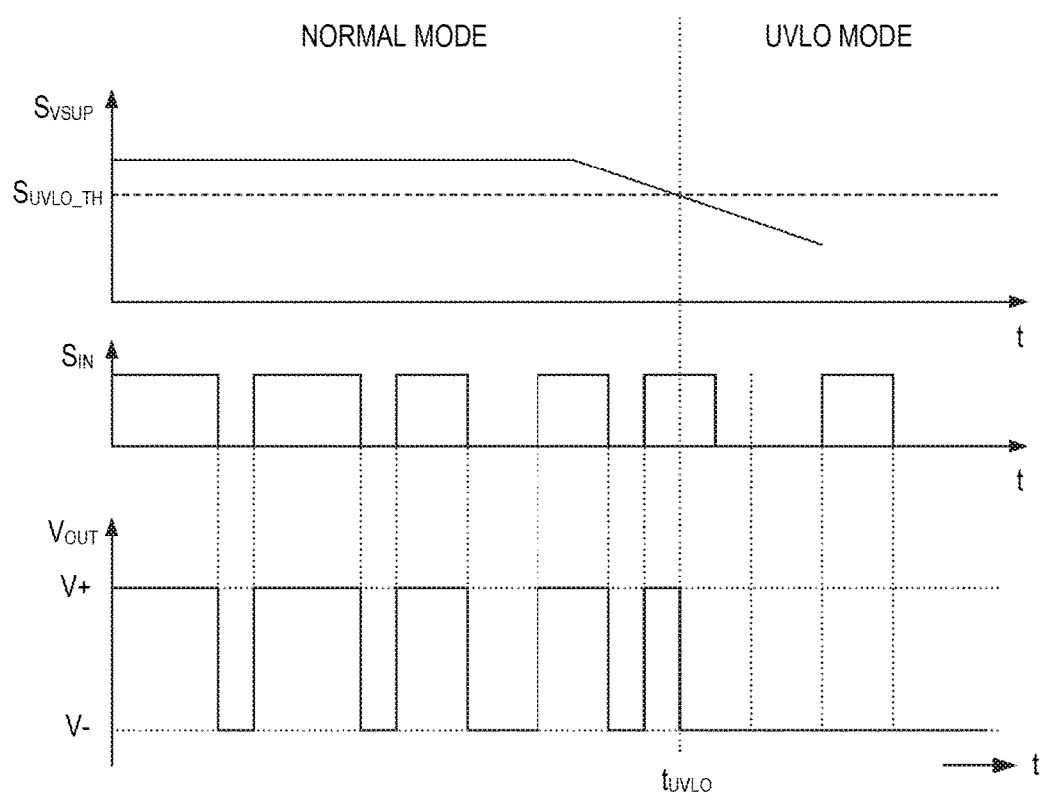
FIG. 3 shows signal diagrams that illustrate one example of how the drive circuit may operate in a normal mode and an undervoltage lockout (UVLO) mode.

FIG. 3 shows signal waveforms that illustrate operation of the drive circuit 1 in the first mode (normal mode) and the second mode (UVLO mode). In particular, FIG. 3 shows signal waveforms of the supply voltage signal $S_{VSUP}$, the input signal $S_{IN}$ and the output potential $V_{OUT}$, which is the electrical potential at the output node 12. The drive circuit 1 is in the normal mode if the supply voltage $V_{SUP}$ is higher than an undervoltage lockout threshold UVLO_TH. In the example shown in FIG. 3, the UVLO threshold UVLO_TH is represented by an UVLO threshold signal $S_{UVLO\_TH}$. The drive circuit 1 compares the supply voltage signal $S_{VSUP}$ with the UVLO threshold signal $S_{UVLO\_TH}$ and operates in the normal mode if the supply voltage signal $S_{VSUP}$ is higher than the threshold signal $S_{UVLO\_TH}$, and in the UVLO mode if the supply voltage signal $S_{VSUP}$ is below the threshold signal $S_{UVLO\_TH}$. In the example illustrated in FIG. 3, the supply voltage $V_{SUP}$ represented by the supply voltage signal $S_{VSUP}$ falls below the UVLO threshold UVLO_TH represented by the UVLO threshold signal $S_{UVLO\_TH}$ at a time instance $t_{UVLO}$. Thus, in this example, the drive circuit 1 operates in the normal mode before $t_{UVLO}$ and in the UVLO mode after $t_{UVLO}$. In the normal mode, the drive circuit 1 generates the output potential $V_{OUT}$, which may also be referred to as output signal, dependent on the input signal $S_{IN}$ and based on the first and second supply potentials V+, V−. In the UVLO mode, the drive circuit 1 generates the output potential $V_{OUT}$ independent of the input signal $S_{IN}$ in a predefined fashion.

Referring to FIG. 3, the input signal $S_{IN}$ may have two different signal levels, an on-level indicating that it is desired to switch on the transistor device 101, or an off-level indicating that it is desired to switch off the transistor device 101. Just for the purpose of illustration, the on-level of the input signal $S_{IN}$ is a high signal level in the example illustrated in FIG. 3, and the off-level is a low signal level. Referring to the above, the transistor device 101 is a voltage controlled transistor device that switches on or off dependent on the gate-source voltage $V_{GS}$. The transistor device 101 switches on if the gate-source voltage $V_{GS}$ is higher than a threshold voltage of the transistor device and switches off, if the gate-source voltage is below the threshold voltage. In the normal mode, the drive circuit 1 generates the output potential $V_{OUT}$ based on the input signal $S_{IN}$ such that the output potential $V_{OUT}$ is high enough to switch on the transistor device 101 whenever the input signal $S_{IN}$ has an on-level and such that the output potential $V_{OUT}$ is low enough to switch off the transistor device 101 whenever the input signal $S_{IN}$ has an off-level. According to one example, the drive circuit 1 is configured to connect the output 12 to the first supply node 13 when the input signal $S_{IN}$ has an on-level and to the second supply node 14 when the input signal $S_{IN}$ has an off-level. Thus, as illustrated in FIG. 3, the output potential $V_{OUT}$ substantially equals the first supply potential V+ when the input signal $S_{IN}$ has an on-level and substantially equals the second supply potential V− when the input signal $S_{IN}$ has an off-level. There may be delay times between rising edges and falling edges of the input signal $S_{IN}$ and corresponding edges of the output potential $V_{OUT}$. These delay times may be due to propagation delays in the drive circuit 1. Such delay times, however, are not illustrated in FIG. 3. Further, by virtue of the optional gate resistor 104 and internal capacitances of the transistor device 101, the output potential $V_{OUT}$ may change slower than schematically illustrated in FIG. 3. According to one example, in the UVLO mode, the drive circuit 1 connects the output node 12 to the second supply node 14, so that the output potential $V_{OUT}$ equals the second supply potential V−.

The gate-source voltage $V_{GS}$ of the transistor device 101 is dependent on how the supply voltage $V_{SUP}$ received by the drive circuit 1 is generated. In each case, when the drive circuit 1 connects the output node 12 to the first supply node 13 so that the output potential $V_{OUT}$ equals the first supply potential V+, the gate-source voltage $V_{GS}$ substantially equals the first voltage $V_{SUP+}$. When the drive circuit 1 connects the output node 12 to the second supply node 14 so that the output potential $V_{OUT}$ equals the second supply potential V−, the gate-source voltage $V_{GS}$ is either zero, if the second voltage source 103 is omitted (replaced by a short circuit), or substantially equals −$V_{SUP-}$, which is the inverted second voltage $V_{SUP-}$. A magnitude of the first voltage $V_{SUP+}$ is dependent on the specific type of transistor device 101 that is to be driven. Whether there is a second voltage source 103 is also dependent on the specific type of the transistor device 101. And, the magnitude of the second voltage $V_{SUP-}$, if there is any, is also on the specific type of the transistor device 101.

If, for example, the transistor device 101 is a silicon MOSFET, the first voltage $V_{SUP+}$ may be selected from a range of between 6V and 10V and the second supply voltage source 103 may be omitted. In this case, the gate-source voltage $V_{GS}$ may range between 6V and 10V in the on-state and is zero in the off-state. If, for example, the transistor device 101 is an IGBT, the first voltage $V_{SUP+}$ may be selected from a range of between 10V and 15V and the second voltage $V_{SUP-}$ may be selected from a range of between 5V and 15V. In this example, the gate-source voltage $V_{GS}$ ranges between 10V and 15V in the on-state and between −5V and −15V in the off-state. If the transistor device 101 is a silicon carbide (SiC) MOSFET, the first voltage $V_{SUP+}$ may range from between 15V and 20V and the second voltage $V_{SUP-}$ may range from between 3V and 5V.

The UVLO threshold UVLO_TH may be selected such that a proper function of the drive circuit 1 is guaranteed if the supply voltage $V_{SUP}$ is higher than the UVLO threshold UVLO_TH. In particular, the UVLO threshold UVLO_TH may be selected such that the drive circuit, in the normal mode, generates a gate-source voltage $V_{GS}$ that is suitable to switch on or switch off the transistor device 101. The gate-source voltage $V_{GS}$, however, is dependent on the magnitude of the supply voltage $V_{SUP}$ and whether or not the second supply potential V− is generated such that it is below the source potential $V_S$. Based on this, having a fixed UVLO threshold UVLO_TH would not work, as will be understood by the following example. If, for example, the transistor device 101 is a silicon MOSFET and the supply voltage $V_{SUP}$ is generated such that in a faultless state, the first supply potential V+ is 10V above the source potential $V_S$ and the second supply potential V− equals the source potential $V_S$, the UVLO threshold UVLOS_TH may be set to 5V, for example. In this case, the drive circuit 1 may operate in the normal mode if the supply voltage $V_{SUP}$ is higher than 5V, which means that the first supply potential V+ is more than 5V higher than the source potential $V_S$ so that in the on-state, the gate-source voltage $V_{GS}$ is higher than 5V. This is sufficient to safely switch on the transistor device 101. The same UVLO threshold UVLO_TH, however, may not be suitable, if the transistor device 101 is an IGBT and the supply voltage $V_{SUP}$ is generated such that the first supply potential V+ is 10V above the source potential $V_S$ and the second supply potential V− is 3V below the source potential $V_S$. If the supply voltage $V_{SUP}$ decreases to 5V in this example, the first supply potential V+ may only be 2V above the source potential $V_S$, which may not be sufficient to safely switch on the transistor device 101.

This example is based on the assumption that, when the supply voltage $V_{SUP}$ decreases, only the first supply potential V+ decreases relative to the source potential $V_S$, that is, a difference between the first supply V+ and the source potential $V_S$ decreases and a difference between the source potential $V_S$ and the second supply potential V− substantially remains the same. However, it is also possible that, when the supply voltage decreases $V_{SUP}$ (only or additionally to a decrease of the first supply potential V+ relative to the source potential $V_S$) the negative second supply potential V− increases relative to the source potential $V_S$, so that a difference between the source potential $V_S$ and the second supply potential V− decreases. This, however, can be considered less critical as it results in an increase of the UVLO threshold UVLO_TH relative to the source potential $V_S$, that is, a difference between the UVLO threshold UVLO_TH and the source potential $V_S$ increases.

Figure 4:
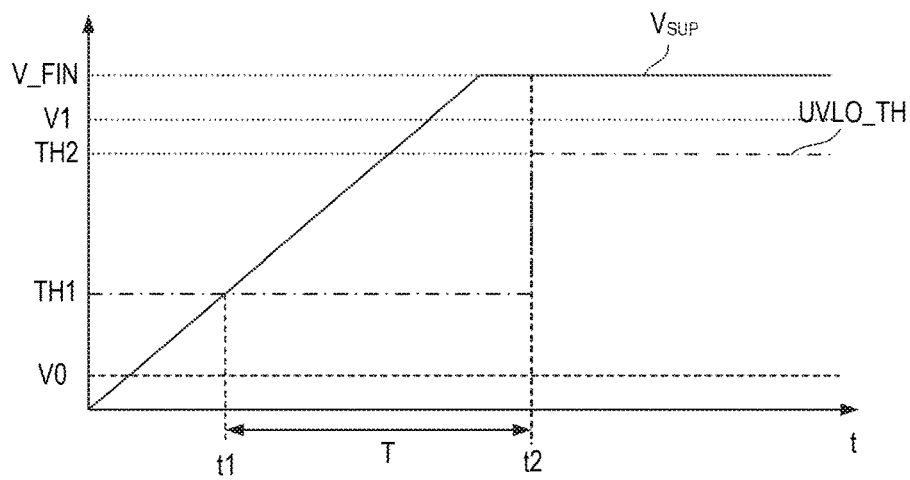
FIG. 4 shows a signal diagram that illustrates one example of a calibration routine configured to obtain a UVLO threshold.
Figure 5:
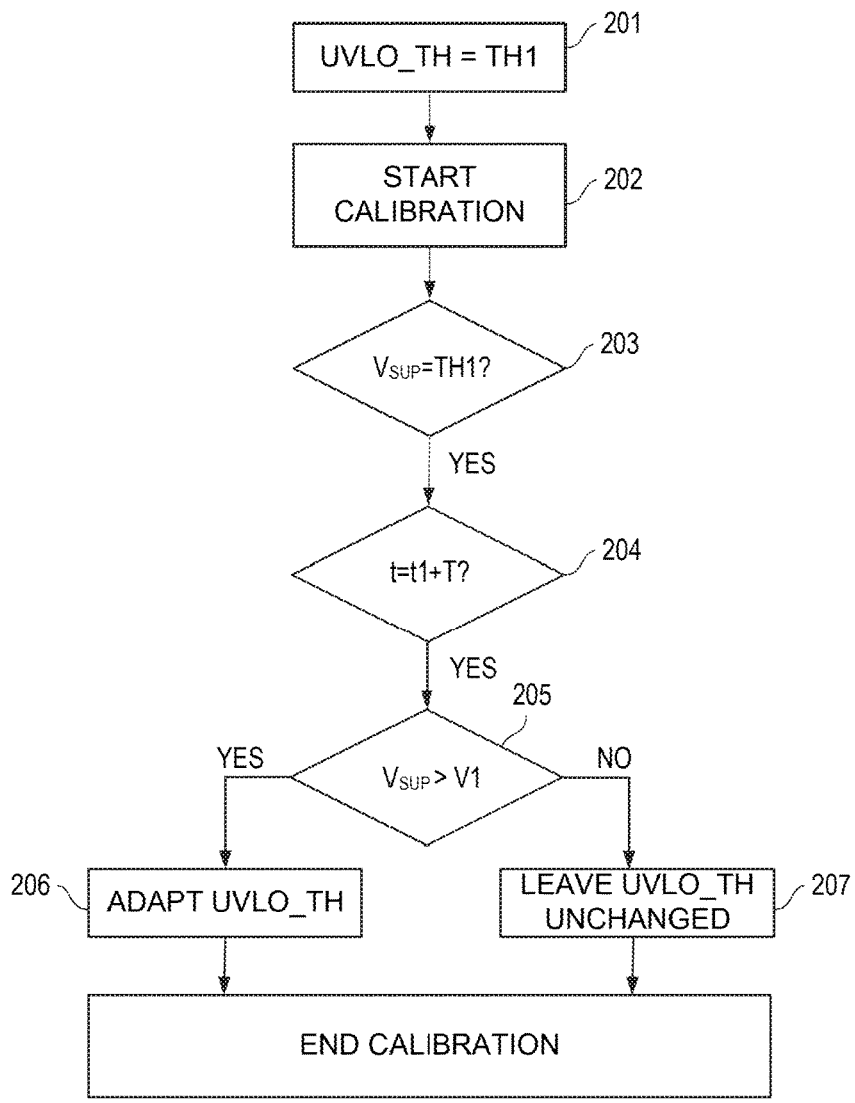
FIG. 5 shows a flowchart of a calibration routine.

In order to make the drive circuit 1 suitable for driving different types of transistor devices 101, the UVLO circuit 2 is configured to run a calibration routine in which the UVLO threshold UVLO_TH is generated based on the supply voltage $V_{SUP}$. One example of a calibration routine performed by the UVLO circuit 3 is illustrated in FIGS. 4 and 5. FIG. 4 shows timing diagrams of the supply voltage $V_{SUP}$ and the UVLO threshold UVLO_TH during the calibration routine, and FIG. 5 shows a flow chart that illustrates the calibration routine. In FIGS. 4 and 5, reference is made to the supply voltage $V_{SUP}$ and the UVLO threshold UVLO_TH. It should be noted that processing in the UVLO circuit 2 takes place based on the supply voltage signal $S_{VSUP}$ that represents the supply voltage $V_{SUP}$ and that the UVLO circuit 2 generates an UVLO threshold signal $S_{UVLO\_TH}$ that represents the UVLO threshold UVLO_TH.

Before the calibration routine, the UVLO threshold UVLO_TH has a first level TH1. The UVLO threshold UVLO_TH (more precisely, the UVLO threshold signal $S_{UVLO\_TH}$ representing the UVLO threshold UVLO_TH) can be stored in a register (not shown in the drawings) of the UVLO circuit 2 so that the UVLO threshold UVLO_TH is available at system start-up after the supply voltage $V_{SUP}$ had decreased to zero. According to one example, the calibration routine starts (see block 202 in FIG. 5) when the supply voltage $V_{SUP}$, after it had fallen below a start threshold V0, rises above the start threshold V0. After the beginning of the calibration routine, the UVLO circuit 2 monitors the supply voltage $V_{SUP}$ and adapts the UVLO threshold UVLO_TH when the supply voltage $V_{SUP}$ (in the calibration routine) exceeds a predefined first voltage level V1. If the supply voltage $V_{SUP}$, in the calibration routine, does not exceed the first voltage level V1, the UVLO threshold UVLO_TH remains on the first threshold level TH1.

The duration of the calibration routine may be defined in several ways. In the example shown in FIG. 4, the UVLO circuit 2 detects when the supply voltage $V_{SUP}$ reaches the UVLO start level TH1. This is represented by block 203 in FIG. 5 and occurs at time instance t1 illustrated in FIG. 4. After a predefined time period T after this time instance t1 has elapsed the UVLO circuit 2 evaluates the supply voltage $V_{SUP}$ and, based on this evaluation, adapts the UVLO threshold UVLO_TH or leaves the UVLO threshold UVLO_TH unchanged. In FIG. 4, t2 denotes the time instance when this evaluation of the supply voltage $V_{SUP}$ takes place. The calibration routine ends after this time instance t2. Referring to FIG. 5, evaluating the supply voltage $V_{SUP}$ at time instance t2 may include comparing the supply voltage $V_{SUP}$ with a further voltage level V1, which is higher than the start level TH1. According to one example, the UVLO circuit 2 adapts the UVLO threshold UVLO_TH if the supply voltage $V_{SUP}$ is higher than the voltage level V1 (see block 206 in FIG. 5) and leaves the UVLO threshold UVLO_TH unchanged if the supply voltage $V_{SUP}$, at time instance t2, is not higher than the further voltage level V1.

It should be noted that defining the end of the calibration routine based on a time instance t1 when the supply voltage $V_{SUP}$ reaches the start level TH1 and based on a predefined time period T is only one example. According to another example, the calibration circuit 2 evaluates the supply voltage $V_{SUP}$ after a predefined time period has elapsed after the beginning of the calibration routine.

Figure 6:
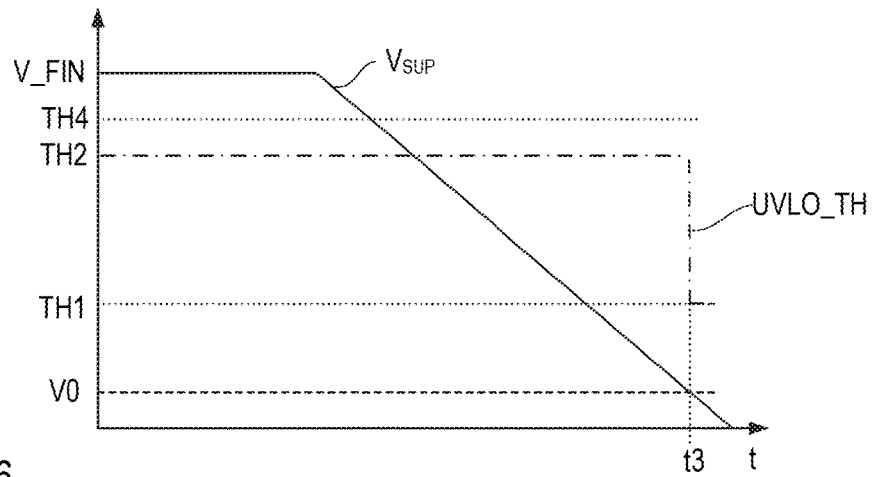
FIG. 6 shows signal diagrams that illustrate how a UVLO threshold may be reset.

In the example illustrated in FIG. 4, the supply voltage $V_{SUP}$, at the evaluation time t2, is higher than the voltage threshold V1 so that the UVLO threshold UVLO_TH is adapted to a second level TH2 in the calibration routine. Referring to FIG. 6, the UVLO threshold UVLO_TH may be reset from the second level TH2 to the first level TH1 when the supply voltage $V_{SUP}$ falls below the start level V0. This is illustrated at time instance t3 in FIG. 6.

The UVLO threshold UVLO_TH may be adapted in several ways if the supply voltage $V_{SUP}$ exceeds the voltage level V1 in the calibration routine. Some examples of how the UVLO threshold UVLO_TH may be adapted are explained in the following.

According to one example, the second threshold level TH2 is fixed and, therefore, independent of a voltage level of the supply voltage $V_{SUP}$ at the evaluation time t2. This voltage level of the supply voltage $V_{SUP}$ at the evaluation time t2 is labelled with V_FIN in FIG. 4. According to one example, the second threshold TH2 is selected from between 1.2 times the first threshold TH1 and 1.5 times the first threshold TH1, as provided by Equation (2):

$$1.2 \cdot TH1 < TH2 < 1.5 \cdot TH1 \qquad (2).$$

According to another example, the second threshold TH2 is adapted such that it is dependent on the voltage level V_FIN of the supply voltage $V_{SUP}$ at the evaluation time t2. According to one example, the second threshold TH2 is proportional to the voltage level V_FIN at the evaluation time T2, as provided by Equation (3):

$$Th2 = c \cdot V\_FIn \qquad (3),$$

where c is a constant, with c<1. According to one example, c is selected from between 0.6 and 0.8.

According to another example, the second threshold TH2 is provided by Equation (4):

$$TH2 = V\_FIN - V\_OFFSET \qquad (4),$$

where V_OFFSET is a predefined offset. According to one example, the offset V_OFFSET is selected from between 2V and 4V.

According to yet another example, the second threshold TH2 is dependent on the first threshold TH1 and a difference between the voltage level V_FIN at the evaluation time t2 and the first threshold TH1. For example, Equation (5) provides:

$$TH2 = TH1 + d \cdot (V_{FIN} - TH1) \qquad (5),$$

where d is a constant, with d<1. According to one example, d is selected from between 0.6 and 0.8.

Figure 7:
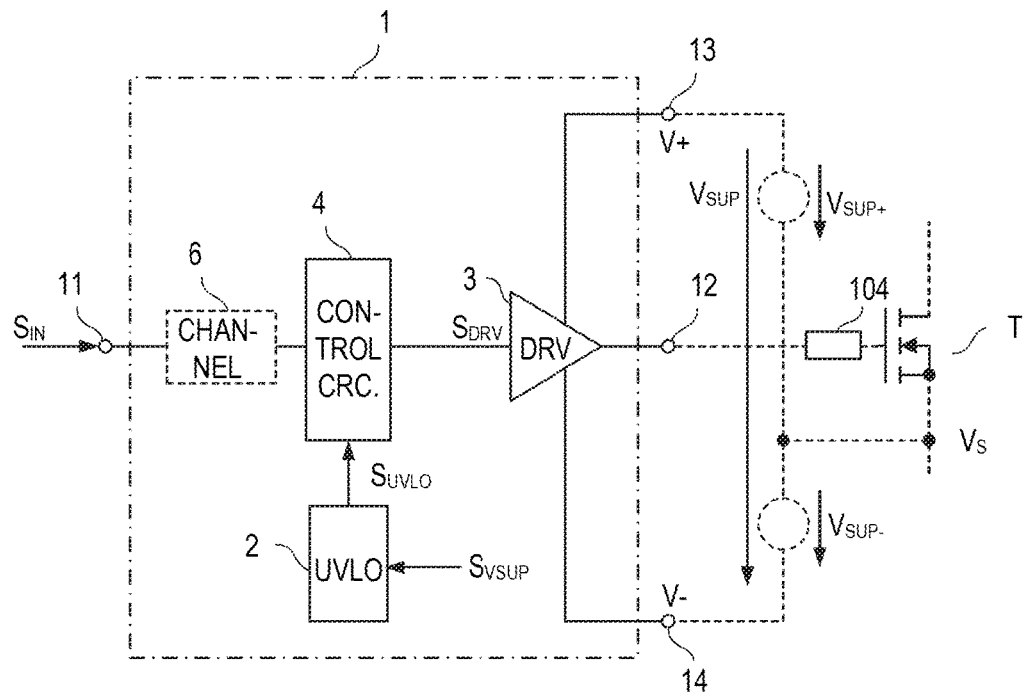
FIG. 7 shows a block diagram of a drive circuit with a UVLO circuit, a control circuit, and a driver.

FIG. 7 shows one example of the drive circuit 1 in greater detail. In this example the drive circuit 1 includes a driver 3 that is coupled to the first supply node 13, and the second supply node 14 and receives a drive signal $S_{DRV}$. A control circuit 4 generates the drive signal $S_{DRV}$ received by the driver 3 based on the input signal $S_{IN}$ and an UVLO signal $S_{UVLO}$ provided by the UVLO circuit 2. The UVLO circuit 2 generates the UVLO signal $S_{UVLO}$ based on the supply voltage $V_{SUP}$ (more precisely, the supply voltage signal $S_{VSUP}$) and the UVLO threshold UVLO_TH obtained in the calibration routine (more precisely, based on a signal representing the UVLO threshold UVLO_TH). Optionally, the drive circuit 1 includes a transmission channel 6 between the input 11 and the control circuit 4. This transmission channel 6 may include a potential barrier such as, for example, a transformer, an optocoupler, a levelshifter or the like. This type of transmission channel 6 "transfers" the input signal $S_{IN}$ from one voltage domain to another voltage domain but does not affect the information included in the input signal $S_{IN}$. A signal received by the control circuit 4 therefore corresponds to the input signal $S_{IN}$.

It should be noted that the block diagram shown in FIG. 7 illustrates the functional blocks of the drive circuit 1 rather than a specific implementation. These functional blocks can be implemented in various ways. According to one example, these functional blocks are implemented using dedicated circuitry. According to another example, the drive circuit 1 is implemented using hardware and software. For example, the drive circuit or functional blocks of the drive circuit 1 may include a microcontroller and software running on the microcontroller.

Figure 8:
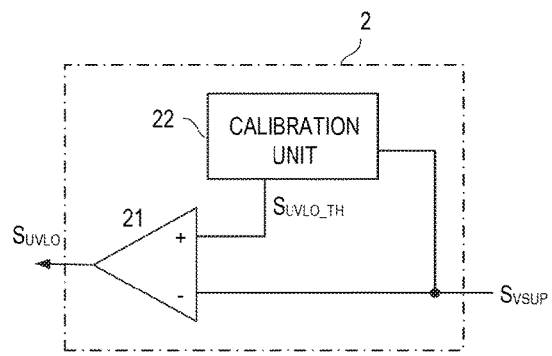
FIG. 8 shows one example of the UVLO circuit.

FIG. 8 schematically illustrates one example of the UVLO circuit 2. In this example, the UVLO circuit 2 includes a comparator that receives the supply voltage signal $S_{VSUP}$ and the UVLO threshold signal $S_{UVLO\_TH}$ and generates the UVLO signal $S_{UVLO}$ based on comparing the supply voltage signal $S_{VSUP}$ with the UVLO threshold signal $S_{UVLO\_TH}$. A calibration unit 22 receives the supply voltage signal $S_{VSUP}$ and is configured to run a calibration routine in accordance with one of the examples explained with reference to FIGS. 4 and 5 herein before and generate the UVLO threshold signal $S_{UVLO\_TH}$ in the calibration routine.

Figure 9:
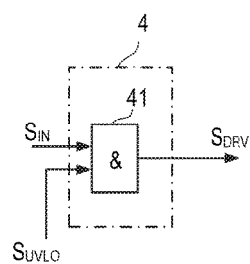
FIG. 9 shows one example of the control circuit.

FIG. 9 illustrates one example of the control circuit 4. In this example, the control circuit 4 includes a logic gate 41 that receives the input signal $S_{IN}$ and the UVLO signal $S_{UVLO}$ and generates the drive signal $S_{DRV}$ based on these signals. The drive circuit 1 operates in the normal mode or the UVLO mode dependent on a signal level of the UVLO signal $S_{UVLO}$. In particular, the drive circuit 1 operates in the normal mode if the UVLO signal $S_{UVLO}$ has a first signal level, which is referred to as normal level in the following, and in the UVLO mode, if the UVLO signal $S_{UVLO}$ has a second signal level, which is referred to as UVLO level in the following. According to one example, the logic gate 41 is configured to pass the input signal $S_{IN}$ through if the UVLO signal $S_{UVLO}$ has the normal level. Thus, in the normal mode, the drive signal $S_{DRV}$ equals the input signal $S_{IN}$. If the UVLO signal $S_{UVLO}$ has the UVLO level, the logic gate 41 generates the drive signal $S_{DRV}$ such that it has a predefined signal level. According to one example, this signal level equals the off-level of the input signal $S_{IN}$. Referring to FIG. 9, the logic gate 41 may be implemented as an AND gate. The normal level of the UVLO signal $S_{UVLO}$ may be a logic low level and the UVLO level may be a logic high level.

Figure 10:
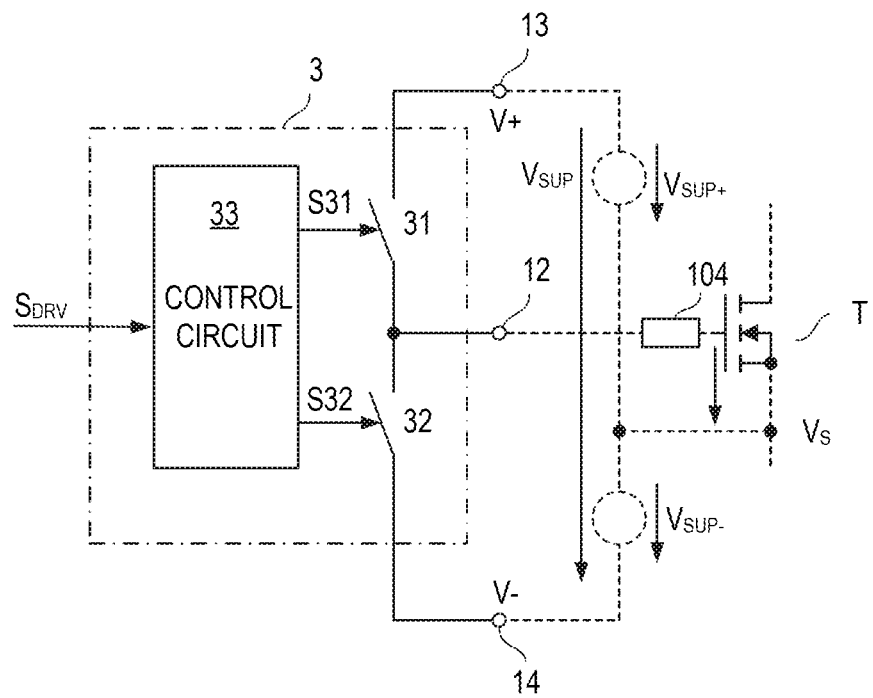
FIG. 10 shows a driver according to one example.
Figure 11:
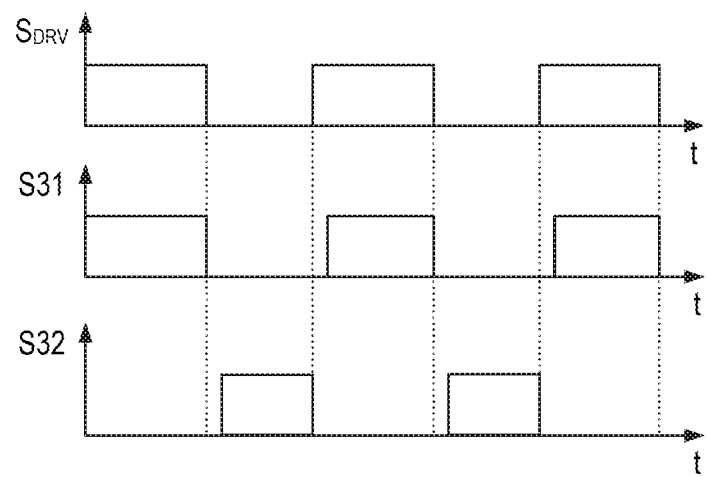
FIG. 11 shows signal diagrams that illustrate one possible operation of the driver shown in FIG. 9.

FIG. 10 shows one example of the driver 3. In this example, the driver includes a first switch 31 connected between the first supply node 13 and the output node 12, and a second switch 32 connected between the second supply node 14 and the output 12. The first and second switch 31, 32 are controlled by a control circuit 33 based on the drive signal $S_{DRV}$. More specifically, the control circuit 33 generates control signals S31, S32 received by the first switch 31 and the second switch 32, wherein these control signals S31, S32 are generated based on the drive signal $S_{DRV}$. The first and second switch 31, 32 may be implemented as any type of electronic switch. According to one example, each of the first switch 31 and the second switch 32 is implemented as a transistor. Referring to the above, in the normal mode, the drive signal $S_{DRV}$ either has an on-level or an off-level. The control circuit 33, according to one example, is configured to switch on the first switch 31 and switch off the second switch 32 when the drive signal $S_{DRV}$ has an on-level, so that the output node 12 is connected to the first supply node 13. Equivalently, the control circuit 33 switches on the second switch 32 and switches off the first switch 31 when the drive signal $S_{DRV}$ has an off-level, so that the output node 12 is connected to the second supply node. This is schematically illustrated in FIG. 11 that shows timing diagrams of the drive signal $S_{DRV}$ and the control signals S31, S32 of the first and second electronic switch 31, 32. Just for the purpose of illustration, an on-level of the drive signal $S_{DRV}$ is a high signal level and an off-level is a low signal level in the example shown in FIG. 11. Equivalently, on-levels of the control signals S31, S32 are high signal levels and off-levels are low signal levels. An on-level of one of the control signals S31, S32 switches on the respective electronic switch 31, 32, and an off-level switches off the respective electronic switch 31, 32. Optionally, there are delay times (dead times) between those time instances when one of the first and second electronic switches 31, 32 switches off and the other one of the first and second electronic switch 31, 32 switches on. Such delay times are schematically illustrated in FIG. 11.

Figure 12:
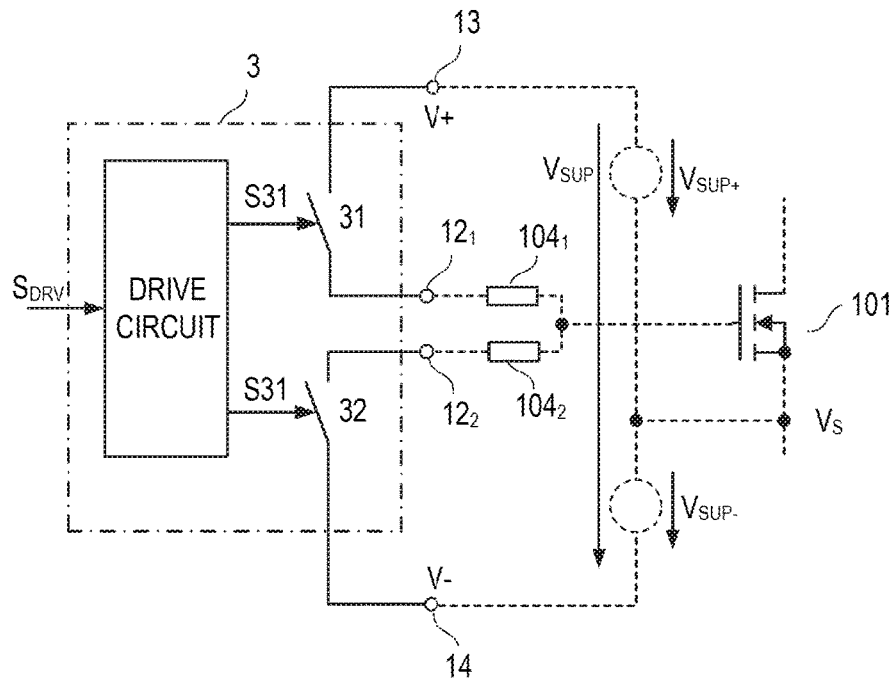
FIG. 12 shows a driver according to another example.

FIG. 12 shows another example of the driver 3. While in the example shown in FIG. 10, the driver 3 and, consequently, the drive circuit 1 includes an output with one output node 12, the driver 3 shown in FIG. 12 includes an output with two output nodes $12_1$, $12_2$. A first output node $12_1$ is coupled to the first supply node 13 via the first switch 31, and the second output node $12_2$ is coupled to the second supply node 14 via the second switch 32. In operation of the drive circuit, the output nodes $12_1$, $12_2$ are coupled to the control node (gate node) of the transistor device 101. The first output node $12_1$ is coupled to the control node via a first gate resistor $104_1$, and the second output node $12_2$ is coupled to the control node via a second gate resistor $104_2$. The first gate resistor $104_1$ governs switching on the transistor device, and the second gate resistor $104_2$ governs switching off the transistor device 101. These resistors $104_1$, $104_2$ may be different, so that different switching speeds can be obtained for switching on and switching off the transistor device.

Figure 13:
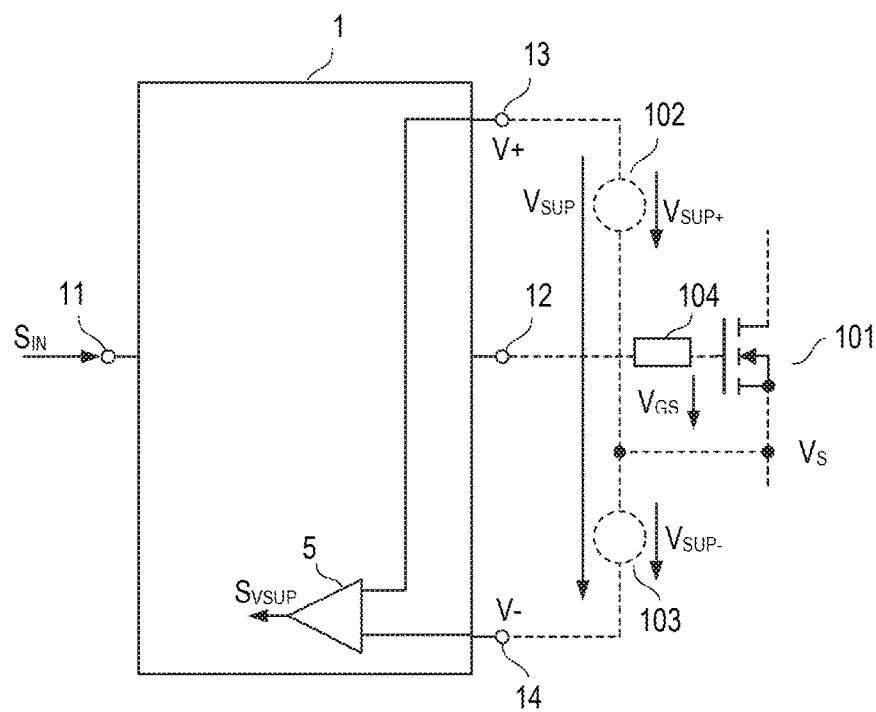
FIG. 13 shows one example of a measurement circuit configured to measure a supply voltage received at the first and second supply node and generate a voltage measurement signal.

FIG. 13 illustrates one example of how the supply voltage signal $S_{VSUP}$ may be generated. In this example, the drive circuit 1 includes a voltage measurement circuit 5 coupled to the first supply node 13 and the second supply node 14. This voltage measurement circuit 5 receives the supply voltage $V_{SUP}$ and generates the supply voltage signal $V_{SUP}$ based on the supply voltage $V_{SUP}$. Any type of voltage measurement circuit may be used to implement the voltage measurement circuit 5 shown in FIG. 13.

Figure 14:
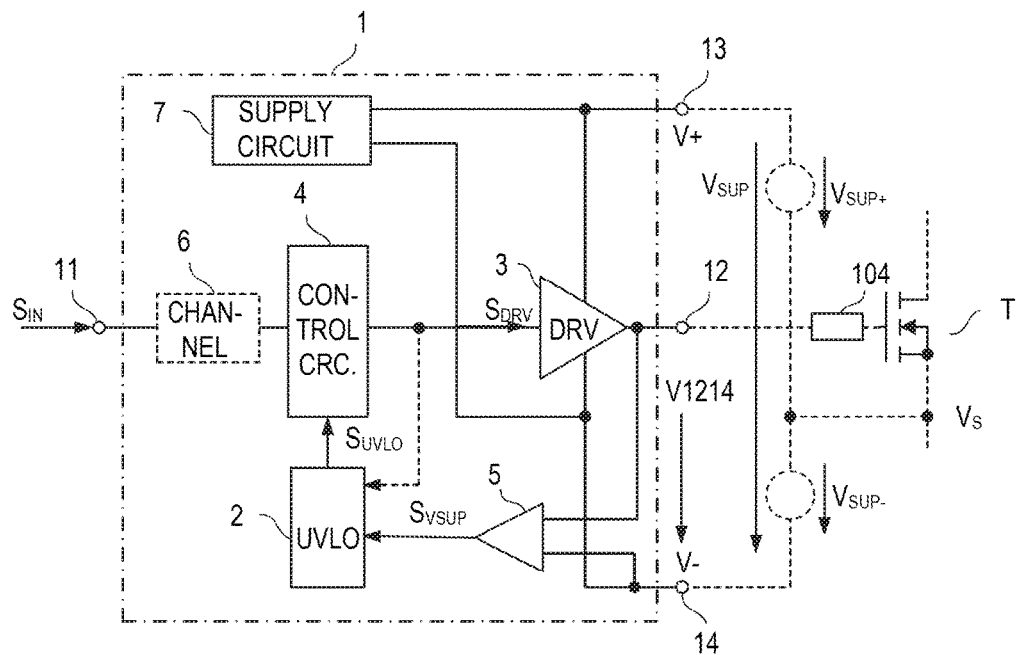
FIG. 14 shows another example of a measurement circuit configured to measure a supply voltage received at the first and second supply node and generate a voltage measurement signal.
Figure 15:
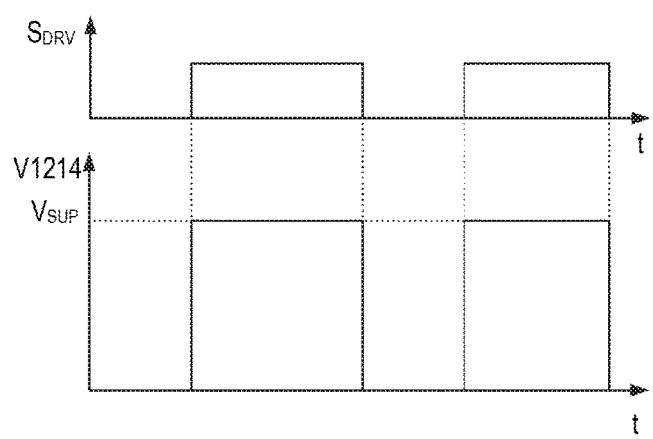
FIG. 15 shows timing diagrams that illustrate signals occurring in the electronic circuit shown in FIG. 14.

According to another example shown in FIG. 14, the voltage measurement circuit 5 is connected between the output node 12 and the second supply node 14 and receives a voltage V1214 between these circuit nodes 12, 14 as an input voltage. This voltage is dependent on the drive signal $S_{DRV}$ received by the driver 3. Referring to FIG. 15 that shows timing diagrams of the voltage V1214 and the drive signal $S_{DRV}$ the voltage V1214 essentially equals the supply voltage $V_{SUP}$ when the drive signal $S_{DRV}$ has an on-level and is zero when the drive signal $S_{DRV}$ has an off-level. That is, in this example, the voltage measurement circuit 5 receives the supply voltage $V_{SUP}$ when the driver based on the drive signal $S_{DRV}$ connects the output 12 to the first supply node 13. According to one example, the UVLO circuit 2 receives the drive signal $S_{DRV}$ and is configured to run the calibration routine when the drive signal has an on-level. According to another example, the UVLO circuit simply detects the voltage V1214, based on which the supply voltage signal $S_{VSUP}$ is generated, and runs the calibration routine when the supply voltage signal $S_{VSUP}$ indicates that the voltage V1214 exceeds a certain threshold, such as the threshold V0 explained with reference to FIG. 4, for the first time after start-up.

The supply voltage $V_{SUP}$ received at the supply nodes 13, 14 is not only used to drive the transistor 101, but is also used to supply the individual circuits inside the drive circuit 2. Referring to FIG. 14, the drive circuit 2 may include an internal supply circuit 7 that receives the supply voltage $V_{SUP}$ and generates supply voltages for the internal circuits, such as the control circuit 4, the driver 3 or the UVLO circuit 2, based on the external supply voltage $V_{SUP}$.

According to one example, the internal supply circuit 7 is configured to generate supply voltages sufficient for operating the internal circuits not until the external supply voltages has reached a predefined threshold, such as the first threshold TH1 explained with reference to FIG. 4. In this case, the voltage V1214 at least equals the first threshold TH1, when an on-level of the drive signal $S_{DRV}$ causes the driver to connect the output 12 with the first supply input 13 for the first time after start up. In this example, the supply voltage $V_{SUP}$ may increase during the first on-pulse or during further on-pulses of the drive signal $S_{DRV}$. The calibration routine in this example may include to start the calibration routine when a first voltage pulse of voltage V1214 occurs and to evaluate the voltage V1214 at an evaluation time instance when the following two conditions are met, (a) a time difference between the evaluation time instance and the beginning of the calibration routine equals at least a predefined time period, such as time period T explained with reference to FIG. 4; and (b) the voltage V1214 is different from zero. The latter prevents that the voltage V1214 is evaluated in time periods when the drive signal $S_{DRV}$ has an off-level and the voltage V1214 does not represent the supply voltage $V_{SUP}$.

According to another example, the internal supply circuit 7 is configured to supply the internal circuits not until the external supply voltage has reached a first maximum after start-up. In this case, already a voltage level of a first voltage pulse of the voltage V1214 after start-up represents the supply voltage. In this case, the calibration routine may include evaluating the voltage V1214 during the first voltage pulse, that is, when the voltage V1214 exceeds a predefined voltage level for the first time.

It should be noted that, in each of the examples explained before, the UVLO threshold may be re-calibrated during operation of the drive circuit 2. That is, the supply voltage $V_{SUP}$ may be measured in any of the ways explained herein before and evaluated in order to adjust he UVLO threshold at any time (long) after start-up.

What is claimed is:

1. An electronic circuit, comprising:
   a first supply node and a second supply node that are configured to receive a supply voltage;
   an input configured to receive an input signal;
   an output configured to be coupled to a control node of a transistor device; and
   an undervoltage lockout (UVLO) circuit configured to perform a comparison of the supply voltage and a UVLO threshold,
   wherein the electronic circuit is configured to operate in one of a first operating mode or a second operating mode based on the comparison,
   wherein the UVLO circuit is configured to generate the UVLO threshold based on the supply voltage in a calibration routine, and
   wherein the electronic circuit is configured to generate the output signal, in the first mode, dependent on the input signal and to generate the output signal, in the second mode, independent of the input signal.

2. The electronic circuit of claim 1, wherein the UVLO circuit is configured, in the calibration routine, to monitor the supply voltage and to generate the UVLO threshold based on comparing the supply voltage with a predefined voltage level.

3. The electronic circuit of claim 2, wherein the UVLO circuit is configured to generate the UVLO threshold such that the UVLO threshold has a first level if the supply voltage does not exceed the predefined voltage level and the UVLO threshold has a second level different from the first level if the supply voltage exceeds the predefined voltage level.

4. The electronic circuit of claim 3, wherein the first level is a predefined threshold.

5. The electronic circuit of claim 3, wherein the second level is a predefined threshold.

6. The electronic circuit of claim 3, wherein the second level is dependent on a voltage level of the supply voltage at an evaluation time instance.

7. The electronic circuit of claim 6, wherein the second level is proportional to the voltage level of the supply voltage at the evaluation time instance.

8. The electronic circuit of claim 6, wherein the second level is dependent on a difference between the voltage level of the supply voltage at the evaluation time instance and the first level.

9. The electronic circuit of claim 1, wherein the UVLO circuit is configured to receive a supply voltage signal representing the supply voltage, and generate the UVLO threshold based on the supply voltage signal representing the supply voltage in the calibration routine.

10. The electronic circuit of claim 9, further comprising:
    a voltage measurement circuit configured to generate the supply voltage signal based on measuring the supply voltage between the first supply node and the second supply node.

11. The electronic circuit of claim 9, further comprising:
    a voltage measurement circuit configured to generate the supply voltage signal based on measuring a voltage between the output node and the second supply node.

12. A method, comprising:
    adjusting an undervoltage lockout (UVLO) threshold of an electronic circuit comprising a first supply node and a second supply node that are configured to receive a supply voltage, an input configured to receive an input signal, and an output configured to be coupled to a control node of a transistor device,
    wherein adjusting the UVLO threshold comprises adjusting the UVLO threshold based on the supply voltage in a calibration routine.

13. The method of claim 12, wherein adjusting the UVLO threshold comprises:
    monitoring the supply voltage; and
    generating the UVLO threshold based on comparing the supply voltage with a predefined voltage level.

14. The method of claim 13, wherein generating the UVLO threshold comprises:
    generating the UVLO threshold such that the UVLO threshold has a first level if the supply voltage does not exceed the predefined voltage level, and
    generating the UVLO threshold such that the UVLO threshold has a second level different from the first level if the supply voltage exceeds the predefined voltage level.

15. The method of claim 14, wherein the first level is a predefined threshold.

16. The method of claim 14, wherein the second level is a predefined threshold.

17. The method of claim 14, wherein the second level is dependent on a voltage level of the supply voltage at an evaluation time instance.

18. The method of claim 16, wherein the second level is proportional to the voltage level of the supply voltage at the evaluation time instance.

19. The method of claim 16, wherein the second level is dependent on a difference between the voltage level of the supply voltage at the evaluation time instance and the first level.

* * * * *